United States Patent [19]

Menigaux et al.

[11] Patent Number: 5,115,285
[45] Date of Patent: May 19, 1992

[54] METHOD OF PRODUCING A QUASI-FLAT SEMICONDUCTOR DEVICE CAPABLE OF A MULTI-WAVELENGTH LASER EFFECT AND THE CORRESPONDING DEVICE

[75] Inventors: Louis Menigaux, Bures sur Yvette; Louis Dugrand, Chelles, both of France

[73] Assignee: Etat Francais, Ministre des Postes, des Telecommunications et de l'Espace (Centre National d'Etudes des Telecommunications), Issy les Moulineaux, France

[21] Appl. No.: 691,362

[22] Filed: Apr. 25, 1991

Related U.S. Application Data

[62] Division of Ser. No. 466,591, Jan. 17, 1990, abandoned.

[30] Foreign Application Priority Data

Jan. 20, 1989 [FR] France .................................. 89 00710

[51] Int. Cl.$^5$ ............................................. H01L 33/00
[52] U.S. Cl. ........................................ 357/17; 357/16; 357/19; 357/55; 385/8
[58] Field of Search ................... 357/55, 50, 49, 43, 357/17, 16, 19; 350/96.14, 96.12; 385/8, 2

[56] References Cited

U.S. PATENT DOCUMENTS

| | | | |
|---|---|---|---|
| 4,318,059 | 3/1982 | Lang et al. | 372/50 X |
| 4,571,729 | 2/1986 | Fujimoto | 372/50 X |
| 4,925,811 | 5/1990 | Menigaux et al. | 372/50 X |
| 4,993,036 | 2/1991 | Ikeda et al. | 372/50 |

OTHER PUBLICATIONS

Welch et al., "N-Phase Emission From Index Guided Laser Array Up to 400 mW", *Electronics Letters*, Mar. 13, 1986, vol. 22, No. 6, pp. 293-294.

Primary Examiner—William Mintel
Attorney, Agent, or Firm—Dennison, Meserole, Pollack & Scheiner

[57] ABSTRACT

A semiconductor device capable of producing a multi-wavelength laser effect comprising a substrate having thereon at least two double heterostructure stacks, each stack comprising at least one active layer bounded by two confinement layers, the stacks being in the form of elongated strips disposed side-by-side, electrically insulated from each other. Each stack comprises a P-N junction therein which is individually and electrically operable and which is situated in the vicinity of an active layer of a different composition and rank in each stack. The transverse opposite ends of the strips are optically prepared and the upper surfaces of the strips form an upper surface for the device which is substantially flat.

4 Claims, 7 Drawing Sheets

METHOD OF PRODUCING A QUASI-FLAT SEMICONDUCTOR DEVICE CAPABLE OF A MULTI-WAVELENGTH LASER EFFECT AND THE CORRESPONDING DEVICE

This is a divisional of copending application Ser. No. 07/466,591 filed on Jan. 17, 1990, now abandoned.

FIELD OF THE INVENTION

This invention relates to semiconductors and more particularly to those which have optical applications.

Here, the term semiconductor refers to a semiconductor having radiative optical properties, that is to say in which the radiation emitted by a P-N junction excited electrically to an energy greater than its forbidden band energy is essentially of an optical rather than an acoustic nature.

BACKGROUND OF THE INVENTION

French Patent Application No. 86 14740 describes a method of producing a multi-wavelength semiconductor laser which is produced on the basis of a double heterostructure stack composed of alternate confinement layers and active layers of different compositions.

It will be evident to those skilled in the art on the one hand that different wavelengths can be obtained from such a stack by making P-N junctions in the vicinity of active layers on a different rank in the stack. On the other hand, this prior art method is in particular aimed at using only one single multi-layer epitaxy (production of double heterostructures at one go), whatever the number of wavelengths desired. Also, in order to meet this target while producing a multi-wavelength laser, the method according to the prior document envisages, prior to formation of P-N junctions, selective erosion of the top of the stack on parallel and mutually adjacent bands in order to expose confinement layers of a different rank at least on two adjacent bands. The confinement layers which are thus laid bare then define parallel terraces separated from one another by transitions and, at least in two adjacent terraces, the active layers subjacent to the confinement layer above are of a different rank and can easily be reached from the surface of the terraces.

The formation of different P-N junctions is carried out therefore by the introduction of impurities in a band included in each terrace, through a staged contact layer arranged on the free surface of the stack.

This impurity introduction stage can be carried out, for instance, by localised diffusion. For this, a diffusion mask is envisaged which has the same number of slots as the desired number of P-N junctions. The mask is applied to the surface of the stack so that each slot is situated over a terrace and the impurities are diffused through these slots. It will be understood therefore that the staged profile of the stack may create problems with regard to satisfactory application of the mask. Indeed, if this latter is correctly applied to the highest terrace, the stepped profile produces a space between the mask and the subsequent terraces. This space, of course, increases with the number of terraces. This has two disadvantages.

The first relates to the fact that a mask does not properly "stick" to a surface which has any irregularities of shape. This is the case here by virtue of the unevenness of the free surface of the stack.

The second relates to the accuracy of location of the impurities in the terrace. Indeed, the greater the space between the slot in the mask and the upper surface of the terrace, the greater is the diffraction phenomenon through the slot and the less accurate will be the implantation of the impurities. This may lead to a less satisfactory quality of the P-N junction formed and to a lack of accuracy in its positioning.

The invention provides a more satisfactory solution to this problem.

SUMMARY OF THE INVENTION

One aim of the invention is to produce in one single multi-layer epitaxy a multi-wavelength laser in which each wavelength may be excited independently or simultaneously with one another and in which each P-N junction is formed with an accuracy which is markedly less dependent upon its place in the stack, whatever the number of wavelengths desired.

Something which has likewise been noted is the current need to produce multi-wavelength lasers in which the different P-N junctions are situated in one and the same plane parallel with the base of the substrate. As it is, current multi-wavelength lasers have P-N junctions which are situated in one and the same plane but inclined in relation to the base of the substrate, by reason of their being located in the vicinity of active layers of different rank.

Another object of the invention, then, is to produce a multi-wavelength laser which is remarkable in the sense that it has P-N junctions situated in one and the same plane parallel with the base of the substrate although they are situated in the vicinity of active layers of a different rank.

In certain optical applications, it is advantageous to carry out a multiplexing of the various wavelengths emitted by a multi-wavelength laser. At present, it is possible to use for the purpose several mono-wavelength lasers which are optically coupled to a multi-mode optical fibre of relatively large diameter. Coupling in this way multiplies the number of components and leads to relatively considerable bulk, whereas the present evolution of the technology is seeking to conceive integrated components which are of a small size.

The invention remedies this shortcoming by proposing the production of a monolithic component which makes it possible optically to couple the various wavelengths emitted by a multi-wavelength laser to a fibre optic which is mono-mode and therefore a smaller diameter.

Therefore, the invention has as object a method of producing a semiconductor device, particularly a device capable of a laser effect, comprising the following stages;

a) preparation of a block comprising a substrate carrying a mono-crystalline double heterostructure stack comprising alternate confinement layers and active layers of different compositions, all these layers having one and the same type of conductivity;

b) the disposition in the stack of this block of parallel and elongated strips containing respectively, in the vicinity of active layers of different rank at least in two adjacent strips, of P-N junctions which can be electrically and individually operable and insulated from one another;

c) optical preparation of the small opposite ends of the said strips, characterised in that stage b) comprises the introduction of impurities of a type of conductivity opposite to that of the confinement layers, through a quasi-flat upper layer formed on at least a part of the upper surface of the stack and having the same type of conductivity as the said impurities or a low but opposite conductivity.

The idea of "quasi-flat" surface is in this case the opposite to a surface having a staged profile as is the case in the earlier French Patent Application No. 8614740.

In a particular embodiment of the invention, the type N active layers have as their composition $Ga_{1-x}, Al_x$ As, As, x being different each time and being less than approximately 10%, while the confinement layers are composed of $Ga_{1-y}, Al_y$ As, y being substantially the same for all and equal to approximately 30%.

The layers of the double heterostructure are advantageously deposited by epitaxy, particularly by liquid phase epitaxy or possibly by molecular beam epitaxy or by vapour phase deposition of organometallic compounds.

In a preferred form of embodiment, the thickness of the active layers is around a tenth of a micron, while that of the confinement layers is around one micron.

In a first alternative embodiment of the invention, stage a) includes an operation to produce a quasi-flat substrate and an operation to form a stack having a quasi-flat free surface constituting the upper surface of the block.

In a second alternative embodiment of the invention, stage a) includes an operation to produce a substrate having elongated steps which are parallel with one another and with the strips, and separated from one another by transitions, and an operation to form a stack having parallel stages or stairheads parallel with the said treads; this stage a) then comprises a stack levelling operation, particularly by a photo engraving type of erosion process prior to the formation of the said upper layer, intended to obtain a quasi-flat free surface on the stack constituting the top surface of the block.

In a first embodiment of the method according to the invention, the said top layer is super-added in stage b) to the quasi-flat top surface of the block by a deposition using epitaxy. The thickness of this top layer is preferably around a tenth of a micron and may include type P gallium arsenide.

In another embodiment of the method according to the invention, stage b) may include an operation to erode the top surface of the block, laying bare at least the major part of the stack surface which is thus eroded, the top level of an active layer then serves as a contact layer.

In stage b), by the introduction of impurities, regions of a reverse type are advantageously formed and extend from the upper layer as far as the active layer of the desired rank in order respectively to form the said P-N junctions.

In stage b) it is possible electrically to insulate the P-N junctions from one another by carrying out locate erosion between the said regions of inverted type, by a dry or wet method, in order to cut grooves which extend from the said top layer as far as at least beyond each P-N junction situated on either side of the corresponding groove, which makes it possible to accommodate the strips.

It is likewise possible electrically to insulate the said P-N junctions by making a protonic implant between the said regions of inverted type in order to accommodate the said strips in this way.

Stage b) likewise includes a metallic deposition of an individual contact on each region of inverted type and a metallic deposition of a common contact on the substrate.

After the optical preparation of the small opposite ends of the strips, particularly by wet or dry machining or by splitting, it is possible by using the first embodiment of the method according to the invention to obtain a semi-conductor device of which the upper surface, that is to say the surface opposite the base of the substrate, is quasi-flat but in which the P-N junctions formed are not situated in a plane parallel with this base but may be situated in an inclinded plane if the P-N junctions are formed in the vicinity of active layers of a rank which differs from one unit to the next.

In a second embodiment of the method according to the invention it is possible to obtain a semi-conductor device of which the upper surface is likewise quasi-flat but in which the P-N junctions are on this occasion situated in one and the same plane parallel with the base of the substrate.

In a third embodiment of the method according to the invention, the operation designed to produce the substrate comprises not only the formation of elongated steps separated from one another by transitions, the formation of a transverse riser extending in a plane substantially perpendicular to the treads and to each transition and defining on the substrate upper and lower 'bottoms' so that they can be stacked; in this alternative embodiment, the method according to the invention then comprises an additional stage aimed at producing in the heart of the stack, at least in the segment supported by the upper 'bottom' a transparent layer which acts as a light guide for luminous emissions from the P-N junctions.

The result is a monolithic component comprising on the one hand a semiconductive structure capable of a multiwavelength laser effect, and on the other a light guide for the various wavelengths emitted by this structure and capable of being connected to a mono-mode fibre optic.

The invention also has as an object a semiconductor device comprising on a substrate at least two stacks of double heterostructure each comprising at least one active layer bounded by two confining layers, these two stacks being in the form of elongated strips disposed side by side, electrically insulated from one another, each comprising a P-N junction which can be electrically operated individually and which is situated in the vicinity of an active layer of a different composition in each of the two stacks, the small opposite ends of these strips being optically prepared, characterised in that the upper surface of the apparatus opposite the base of the substrate is quasi-flat.

The notion of "quasi-flat" is applied here whatever the method used to insulate the strips, because the upper surfaces of the two stacks are substantially at the same level. In a first embodiment, each stack comprises the same number of layers. In a second embodiment, each stack comprises a different number of layers and the substrate then has elongated steps parallel with one another and with the strips and separated from one another by transitions.

In a third embodiment, the substrate comprises furthermore a transverse riser extending in a plane substantially at right-angles to the treads and to each transition and defining on this substrate upper and lower bottoms for stacking and comprising, at least in the sector supported by the upper bottom a transparent layer which forms a light guide for luminous emissions from the P-N junctions.

Further advantages and characteristic features of the invention will become apparent from examination of the following detailed description and from the appended drawings.

DETAILED DESCRIPTION OF THE PREFERRED EMBODIMENTS

Figure 1:
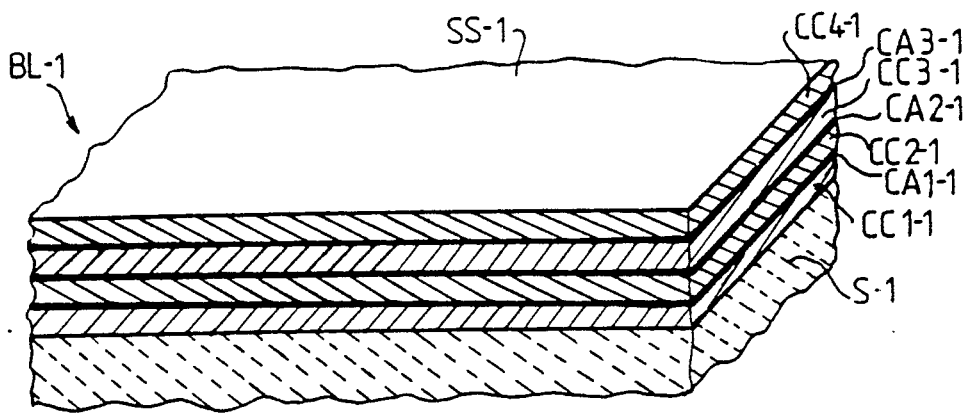
FIGS. 1 to 6 are diagrams illustrating successive stages in a first embodiment of the method according to the invention, resulting in the production of a quasi-flat semiconductor structure in which the P-N junctions formed are situated in one and the same plane which is inclined in relation to the base of the substrate.
Figure 2:
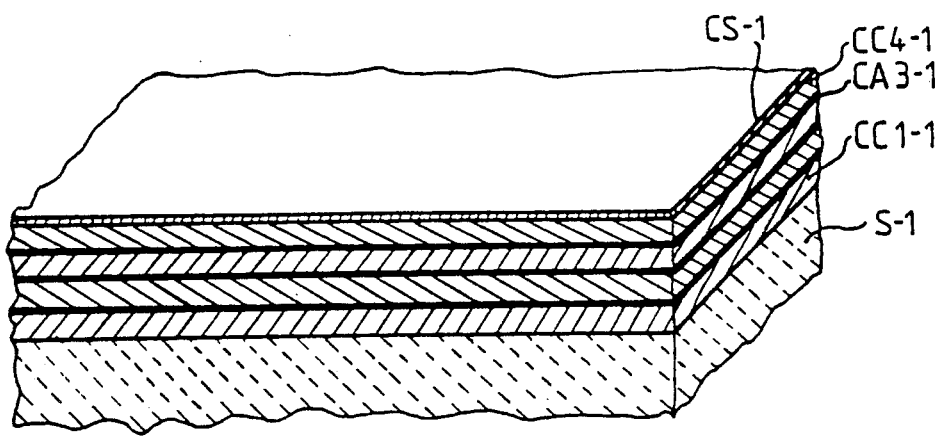

Essentially, the drawings show elements of a certain character. Under this heading, they form an integral part of the description and can not only assist with comprehension of the following detailed description but will also contribute to the definition of the invention if required.

Generally speaking, the references which designate the various elements described will be respectively given the suffixes 1, 2, 3 according to whether they relate to the first, the second or the third embodiment of the method. Furthermore, the references used for these different elements comprise a group of letters (for example, active layer: CA). However, since the invention relates to the production of a device which is capable of a multiwavelength laser effect, there are in each alternative embodiment of the invention a plurality of elements which have similar functions. In this case, they are generically designated by the corresponding group of letters followed by one or two numbers i, j (for example, active layers: CAi). These numbers will be stipulated whenever necessary to identify a particular element. Finally, the various suffixes 1, 2, 3 to the references will be deleted in the description when they are required to refer to elements or stages which are common to all three alternative embodiments.

There now follows a description of the characteristic features common to the various embodiments of the method according to the invention.

Generally speaking, the materials used for the double heterostructure comprise an alloy III-V. This substrate S may likewise comprise an alloy III-V or silicon.

Such semiconductors which are generally monocrystalline unless otherwise mentioned are currently obtained from so-called "III-V alloys", that is to say alloys which combine at least one element from column III and at least element from column V of the Mandelejeff Periodic Classification. Indeed, in the current version of this classification, the columns are IIIA and VA. To be even more precise, they will on the one hand be aluminium, gallium and indium and on the other phosphorous, arsenic and antimony.

In known manner, these materials may have or it may be possible to invest them with a type N or a type P conductivity if they receive suitable impurities. The initial conductivity of the alloys III-V is due to their intrinsic semiconductive property and to the residual impurities due to their method of manufacture. With regard to the type of conductivity acquired, for instance zinc, cadmium, magnesium and beryllium should be quoted, being capable of imparting type P to gallium arsenide, the initial conductivity of which is type N.

Henceforth in the present description, the text will be limited to the cases referred to as the "Ga As system" in which the basic semiconductor is gallium arsenide.

Adopting this hypothesis, the substrate S may consist solely of gallium arsenide of type N+, that is to say exhibiting a high level of type N conductivity. It may likewise consist for the most part of gallium arsenide of type N but then, as will be explained hereinafter, it is necessary that it has at the surface a layer of type N+ gallium arsenide.

The double heterostructure will be produced by epitaxy on this substrate, various layers being stacked. Different epitaxy techniques are known. Liquid phase epitaxy (LPE), or metallo-organic chemical vapour depositions (MOCVD), or even molecular beam epitaxy (MBE) may be employed.

In a particular form of embodiment, the confining layers CCi are all of a type N material to the general formula:

$Ga_{1-y} Al_y As$, that is to say an aluminium-gallium arsenide alloy, in which the proportion of aluminium is y and that of gallium is $1-y$. Typically, y is around 30% and the thickness of the confining layers CCi is about 1 micron.

After epitaxy of the first confining layer CC1 on the substrate S, epitaxy of the first active layer CA1 is performed, its composition being, for instance:

$Ga_{1-x1}, Al_{x1}$, As that is to say it is a gallium aluminium arsenide alloy in which the proportion of alumium atoms is $x_1$ while that of gallium is $1-x_1$. The thickness of the active layer is typically around 0.15 microns. The proportion of aluminium atoms is chosen between 0 and 10% according to the desired wavelength.

Then, a second confining layer CC2 is epitaxied on the first active layer CA1.

Epitaxy of the second active layer CA2 is then performed, its thickness being again about 0.15 microns but the proportion $x_2$ of aluminium and gallium is different.

A third confining layer CC3 is then produced and then a third active layer CA3 with a proportion $x_3$ and finally a last confining layer CC4 which finishes the double heterostructure stack.

Of course, the number of confining layers and active layers may be less or greater according to the number of different frequencies which it is desired to be able to excite in the laser apparatus. The invention assumes that there are at least two different stacked active layers.

It will likewise be assumed that the upper surface SS of the block βL which is thus prepared (stage a)) is quasi-flat. It will be recalled that the idea of a quasi-flat surface contrasts with that of a surface which in particular has terraces, as is the case in French Patent Application No. 86 14740.

Stage b) of the method then consists in providing in the stack of this block parallel and elongated strips RUBi which respectively contain in the vicinity of active layers of a different rank at least in two adjacent strips junctions P-N, Ji, which are electrically operable individually and which are insulated from one another.

In this stage b), there is formed on at least a part of the quasi-flat upper surface SS of the block BL a quasi-flat upper layer CS which is, for example, formed by a monocrystalline semiconductor III–V of a type of conductivity which is opposite to that of the double heterostructure. The simplest way is to produce this upper layer from type P gallium arsenide by epitaxy so that it has a thickness of approximately 0.15 microns.

Once this top layer has been formed, impurities of a conductivity type opposite to that of the confining layers are introduced through it and exhibit, in the case of an upper layer such as that described hereinabove, the same type of conductivity as this upper layer, that is to say type P.

Thus, regions are formed which are of an inverted type Ri which extend from the upper layer to the active layer of the desired rank to form the P-N junctions of the semiconductor device.

In particular, this introduction of impurities may be carried out either by diffusion or by ionic implantation followed by annealing. This introduction operation will be referred to in detail hereinafter but even now it is possible to state that in the case of impurities taken from the group mentioned hereinabove, zinc and cadmium are able to be brought in by diffusion or by ionic implantation, while in principle beryllium, manganese are only brought in by ionic implantation when it is necessary to construct a very limited inverted type of region.

Then an individual metallic contact deposition is applied, DMIi, on each inverted type of region Ri (for example a gold-zinc (Zn,Au)) alloy) and a common contact metallic deposit DMS is applied to the substrate S (for example, a gold-germanium (Au,Ge) alloy). This metallic common contact deposit may be applied under the base of the substrate if this consists of type N+ or in contact with the heavily N+ doped upper layer of this substrate if it is present.

It is likewise appropriate to insulate the P-N junctions electrically from one another.

This operation can be carried out by etching grooves Vij which extend from the upper layer CS at least to beyond each P-N junction Ji situated on either side of the corresponding groove, which makes it possible in this way to accommodate the said strips RUBi. Preferably, these grooves are etched from the upper layer down as far as the substrate S.

These grooves may be made by local erosion by a wet process, that is to say by simple chemical attack or by a dry method, viz.:

reactive ion etching (RIE);
reactive ion beam etching (RIBE);
magnetron ion etching (MIE);
conventional ion machining (UI), or
focussed ion beam machining (FIB).

According to another alternative embodiment of the invention, the electrical insulation between the different P-N junctions may be made by a proton implant instead of making grooves.

For the laser effect to be exhibited, it is necessary optically to prepare the small opposite ends PEi of the strips RUBi which are thus accommodated (FIGS. 6 and 12), that is to say those which are seen in cross-section in the drawings and the opposite end.

This preparation may be carried out in known manner by splitting or even by wet or dry machining.

The resultant semiconductor device is capable of a laser effect and with a different wavelength for each of the P-N junctions formed, to the extent that the active layer in the vicinity of which this P-N junction is formed does not have the same composition for these various regions. It can then selectively emit different wavelengths by means of such a device and in a manner which can be independently controlled.

In so far as it will have been required to prepare a plurality of multi-wavelength laser semiconductor devices on one and the same semiconductor substrate, the production method will, of course, include an additional stage for the separation of the semiconductor device into individual chips each comprising at least two adjacent strips.

The terminal semiconductor device then comprises on one substrate S at least two stacks of double heterostructure each comprising at least one active layer CA framed by two confining layers CCi, CCj, these two stacks being in the form of elongated strips RUBi disposed side by side and electrically insulated from each other, each comprising a P-N junction, Ji, electrically operable individually and situated in the vicinity of an active layer of a different composition for the two stacks. The small opposite ends of these strips are optically prepared. This semiconductor device is remarkable in that its upper surface, that is to say its surface opposite to the base SEM of the substrate S, is quasi-flat. As has been explained hereinabove, the quasi-flat character of the surface is justified whatever the manner of electrically insulating the P-N junctions, because the free surfaces of the stacks are substantially at the same level, particularly as compared with staged levels.

Reference will now be made more particularly to FIGS. 1 to 6 in order to describe the first embodiment of the method according to the invention.

In FIG. 1, the starting point is a quasi-flat substrate S-1 consisting of type N+ gallium arsenide.

The double heterostructure stack formed on this substrate then has a quasi-flat free surface which therefore makes it possible to prepare a block BL-1 having a quasi-flat upper surface SS-1.

It is then possible to proceed (FIG. 2) to deposit the top layer CS-1.

It should be noted here that alternatively this operation to form the top layer could include an operation to erode the upper surface of the block so exposing the active layer CA3-1 in such a way that it serves as a top layer. This would be possible because then the top layer would have a low conductivity of the type opposite that of the impurities by reason of the very composition of this active layer.

Figure 3:
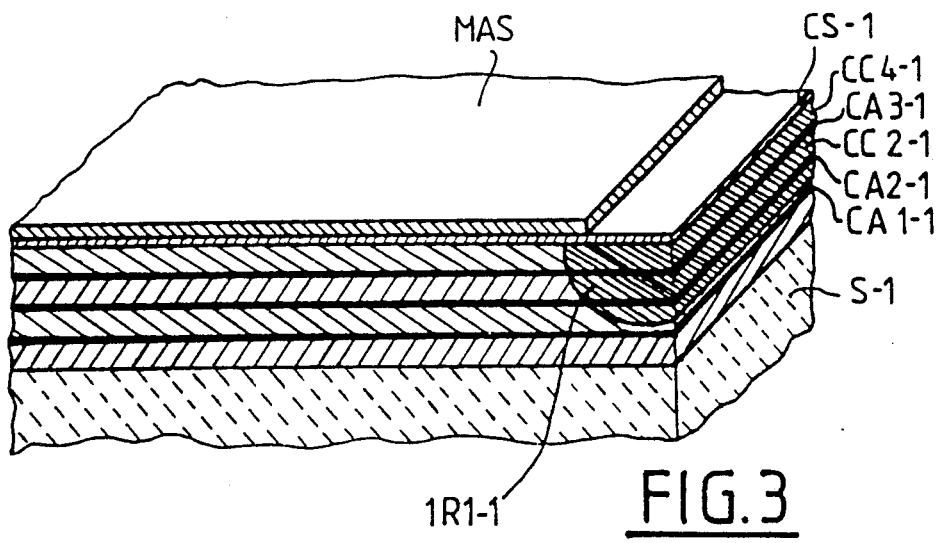
Figure 4:
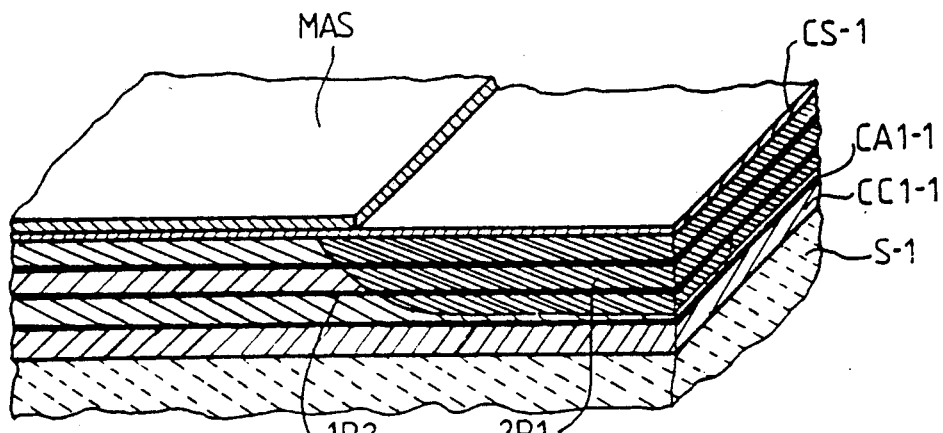
Figure 5:
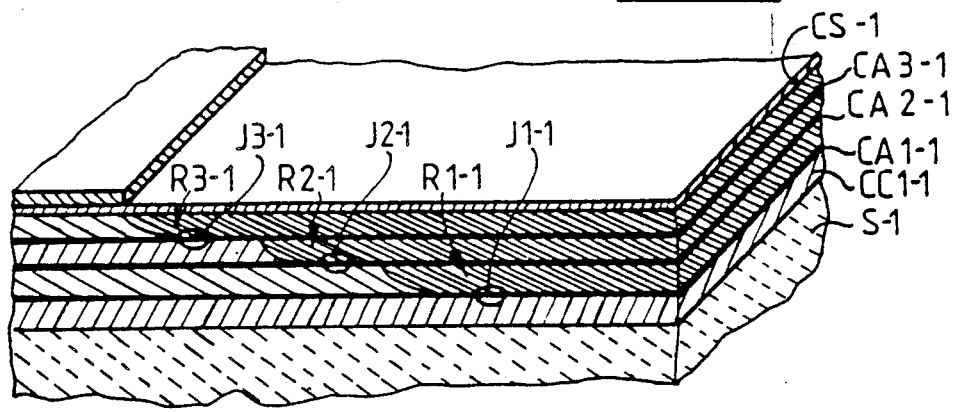

FIGS. 3, 4 and 5 illustrate the operation of introducing impurities through the upper layer CS-1 by diffusion. A man skilled in the art will readily understand that this operation is facilitated by the quasi-flat nature of this upper layer, which makes it possible correctly to apply the diffusion mask MAS to this upper layer.

It will be assumed here that the diffusions are carried out in a sealed ampoule at approx. 640° C. (Celsius) from a zinc arsenide ($ZnAs_2$) diffusion source.

In a first stage (FIG. 3), the mask MAS hides the major part of the upper layer CS-1. Diffusion is then carried out for approximately 60 minutes in order to obtain a first diffused region 1R1-1 of which the bottom part is between the first active layer CA1-1 and the second active layer CA2-1.

In a second phase (FIG. 4), the mask is offset to the left in order to expose a larger part of the upper layer CS-1. Diffusion is then carried out for about 45 minutes. The region 1R1-1 becomes a wider region 2R1-1 of which the bottom limit is closer to the first active layer CA1-1. A second diffused region 1R2-1 is also obtained, the bottom limit of which is between the second and third active layers.

Finally, during the course of a third diffusion stage (FIG. 5) which lasts about 15 minutes, the two diffused regions in FIG. 4 respectively attain the active layer of the desired rank in order to form two regions of inverted type R1-1 and R2-1. These regions R1-1 and R2-1 respectively constitute P-N junctions J1-1 and J2-1 with active layers CA1-1 and CA2-1. During this third diffusion stage, an inverted type of region R3-1 is also formed which, with the third active layer CA3-1, constitutes a third P-N junction, J3-1.

These junctions Ji-1 are illustrated in FIG. 5 although they are not for practical purposes visually identifiable.

A man skilled in the art will readily appreciate that any diffusion has an effect on the regions diffused during previous diffusions and that it is therefore necessary accurately to adjust the diffusion times in order finally to achieve P-N junctions at the level of the active layers of the desired rank.

It can also be seen from FIG. 5 that the three regions of inverted type Ri-1 form one single and continuous zone. However, it is entirely conceivable that these regions might have been formed by localised diffusions, that is to say by using a mask provided with slots so that impurities are only diffused in very precise bands inside the stack.

Figure 6:
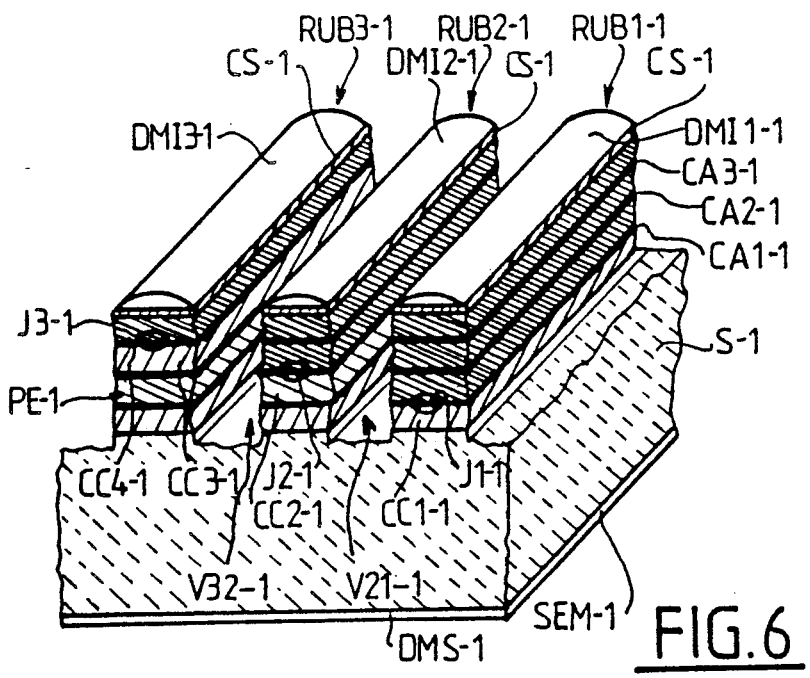
Figure 7:
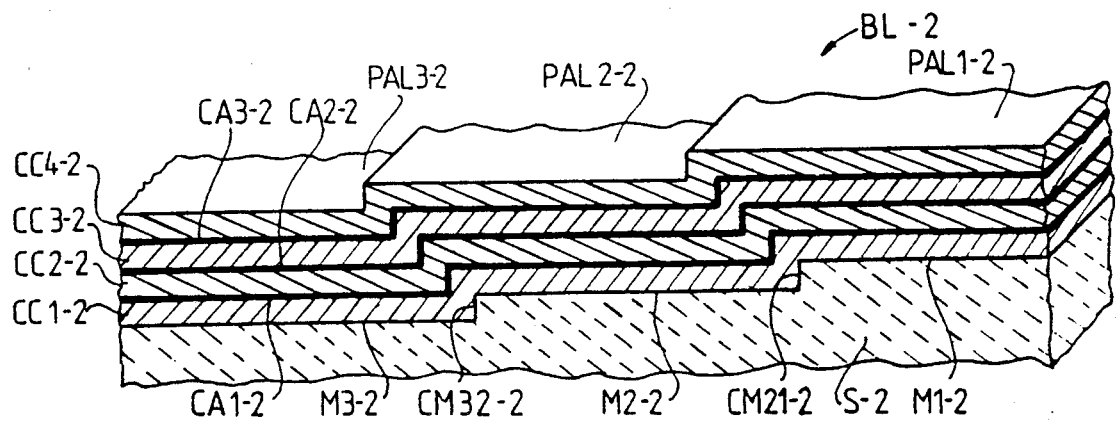
FIGS. 7 to 12 are diagrams illustrating successive stages in a second embodiment of the method according to the invention resulting in the production of a quasi-flat semiconductor structure in which the various P-N junctions formed are situated in one and the same plane parallel with the base of the substrate.

The semiconductor device finally obtained is illustrated in FIG. 6. The common metal contact DMS-1 is fixed on the base SEM-1 of the substrate because the latter consists of type N+ gallium arsenide. Each stack comprises the same number of layers and it will be noted that the three P-N junctions Ji-1 are situated in one and the same plane, which is inclined in relation to the base of the substrate.

The strips thus accommodated have a width of approx. 5 microns, a length of approx. 300 microns and the grooves have a width of about 20 microns.

Reference will now be made more particularly to FIGS. 7 to 12 in order to illustrate the second embodiment of method according to the invention.

Here, it is always assumed that the substrate S-2 is of type N+ gallium arsenide. It should be noted that this substrate S-2 has elongated steps Mi-2 which are parallel with one another and which are of a width of approx. 20 microns, being separated from one another by transitions CMij-2 which have a height of approx. 1 micron. Shown here are three steps M1-2, M2-2, M3-2 separated by respectively two transitions CM21-2 and CM32-2.

The stack which is them formed on this substrate and comprising three active layers and four confining layers have a free surface which comprises stairheads PAL1-2, PAL2-2, PAL3-2 which are parallel with the said treads.

Figure 8:
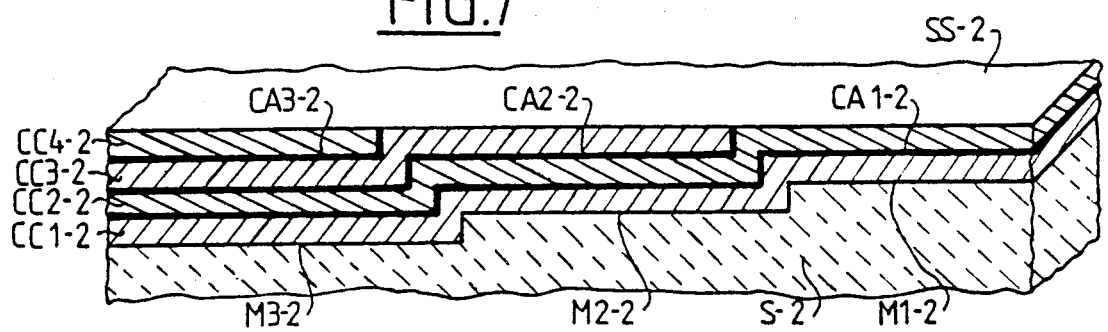

As the free surface of this stack is not quasi-flat, it is a good idea to level it (FIG. 8). This levelling operation consists of eroding, particularly by a photogravure process, the various stairheads of the block BL-2, one after another. The result then is, in succession and from the substrate S-2 as far as the upper surface SS-2 of the block BL-2:

on the tread M1-2: the confining layer CC1-2, the first active layer CA1-2, the second confining layer CC2-2;

on a major part of the tread M2-2: the first confining layer CC1-2, the first active layer, the second confining layer, the second active layer CA2-2, the third confining layer CC3-2;

over the major part of the tread M3-2: the first confining layer, the first active layer, the second confining layer, the second active layer, the third confining layer, the third active layer CA3-2, and finally the fourth confining layer CC4-2.

The upper confining layers are separated by the vertical transitions from the various active layers. These intermediate regions may have certain irregularities with regard to their shape but they are not of any great importance because, as will be seen hereinafter, they will be inhibited upon electrical insulation of the various P-N junctions.

Figure 9:
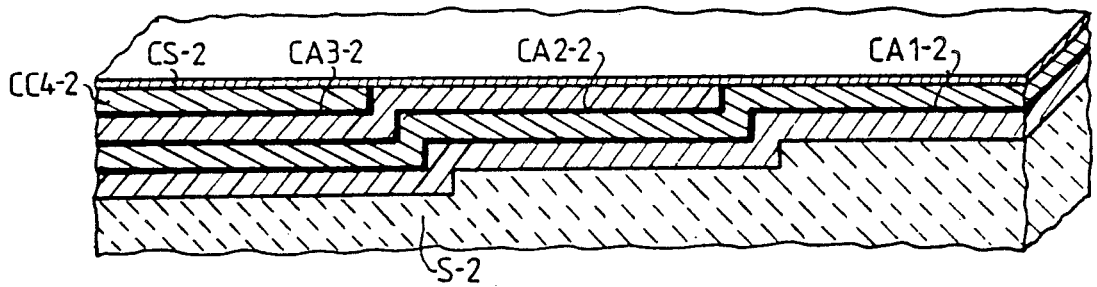

As the upper surface of the block is quasi-flat, it is appropriate now to proceed with deposition of the upper layer CS-2 (FIG. 9). Alternatively, it is conceivable that the operation to form this upper layer might well include an operation to erode the free surface of the stack which would likewise result in a quasi-flat upper surface but which would lay bare at least the major part of the surface which had thus been eroded, the upper surface of an active layer, this latter then serving as a contact layer. Thus, in the present case, it might have been possible to conceive that this eroding operation would on the tread M1-2 lay bare the second active layer CA2-2, on the tread M2-2 the third active layer CA3-2 and on the tread M3-2 a fourth active layer (not shown here). The active layers which are thus exposed would serve as contact layers and would be separated by bands of confining layers. This contact layer would then have a low conductivity of a type opposite to the impurities introduced, by the very nature of their composition.

As the upper surface CS-2 is almost flat, the impurity introduction stage, particularly by diffusion, is particularly simple because the mask is correctly applied against the upper layer. Furthermore, it is only necessary here to carry out a single diffusion stage in order to form all the inverted type regions R1-2, R2-2, R3-2 (FIG. 10) at one go.

A man skilled in the art will note that it has been assumed here that these diffusions were located in a narrow band. However, it is quite conceivable that diffusion is carried out throughout the entire surface area of the upper layer in order to obtain a single continuous zone of the inverted type.

In the present case, for a sealed ampoule diffusion with a zinc arsenide ($ZnAs_2$) diffusion source, the diffusion time needed to form the inverted type regions is approx. 15 minutes at a temperature of 640° C.

Figure 10:
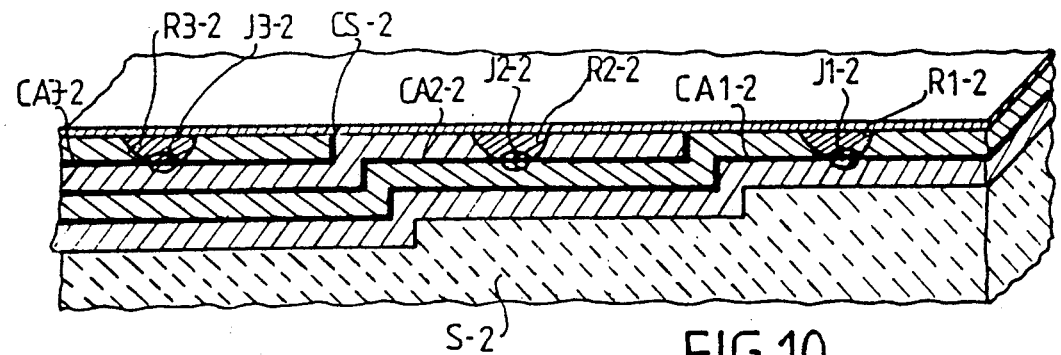

Then, in the vicinity of active layers which are of different rank, P-N junctions Ji-2 are formed which are shown in FIG. 10 although they are not visually identifiable.

Figure 11:
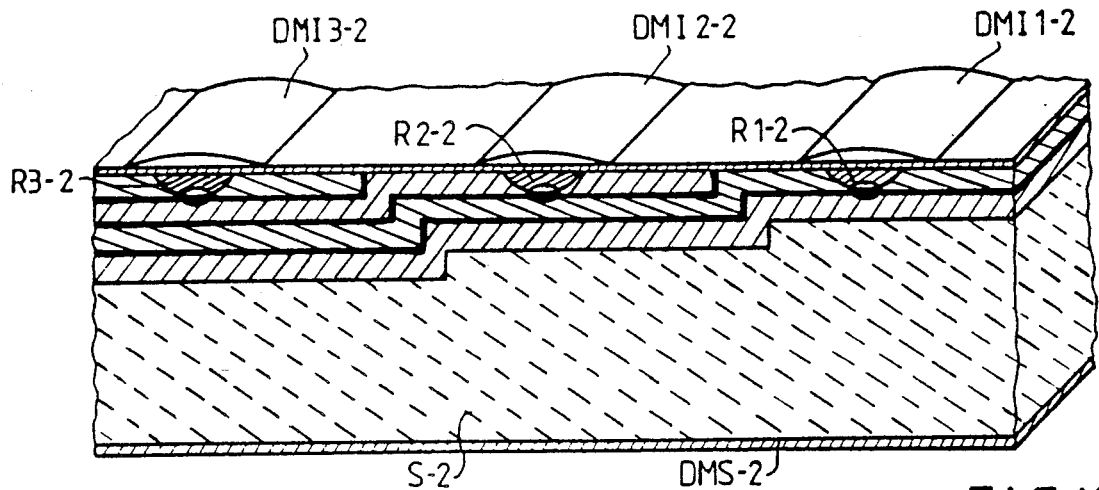

FIG. 11 shows the deposition of an individual contact DMIi-2 on each inverted type region and a metallic deposition of a common contact DMS-2 on the base of the substrate S-2 because this consists of type N+ gallium arsenide.

Figure 12:
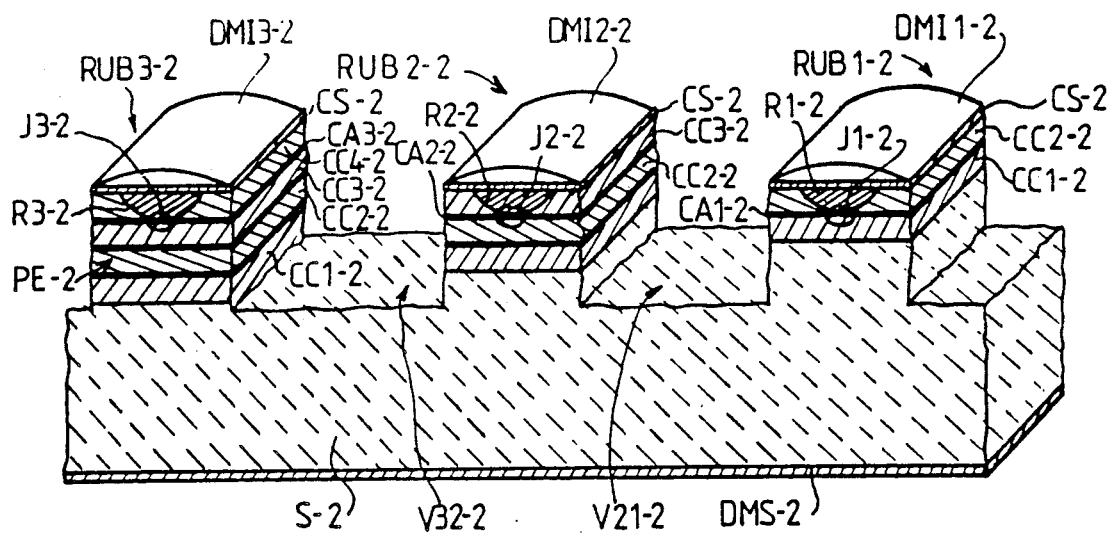

After electrical insulation of the P-N junctions, particularly by grooves V32-2 and V21-2, the result is the semiconductor device shown in FIG. 12.

This quasi-flat semiconductor device, that is to say a device having an upper surface which is opposite to the base of the substrate and which is almost flat is remarkable in that each double heterostructure stack comprises a different number of layers. Thus, the P-N junctions are situated not only in one and the same plane but are even parallel with the base of the substrate.

The strips which are thus accommodated have a width of about 15 microns, a length of about 250 microns and the grooves are about 5 microns wide.

If it has been possible to carry out an overall diffusion through the entire surface of the upper layer, the strips would have had a width of about 5 microns, while the width of the grooves would have been around 15 microns.

Reference will now be made more particularly to FIGS. 13 to 16 in order to illustrate a third embodiment of the method according to the invention.

Figure 13:
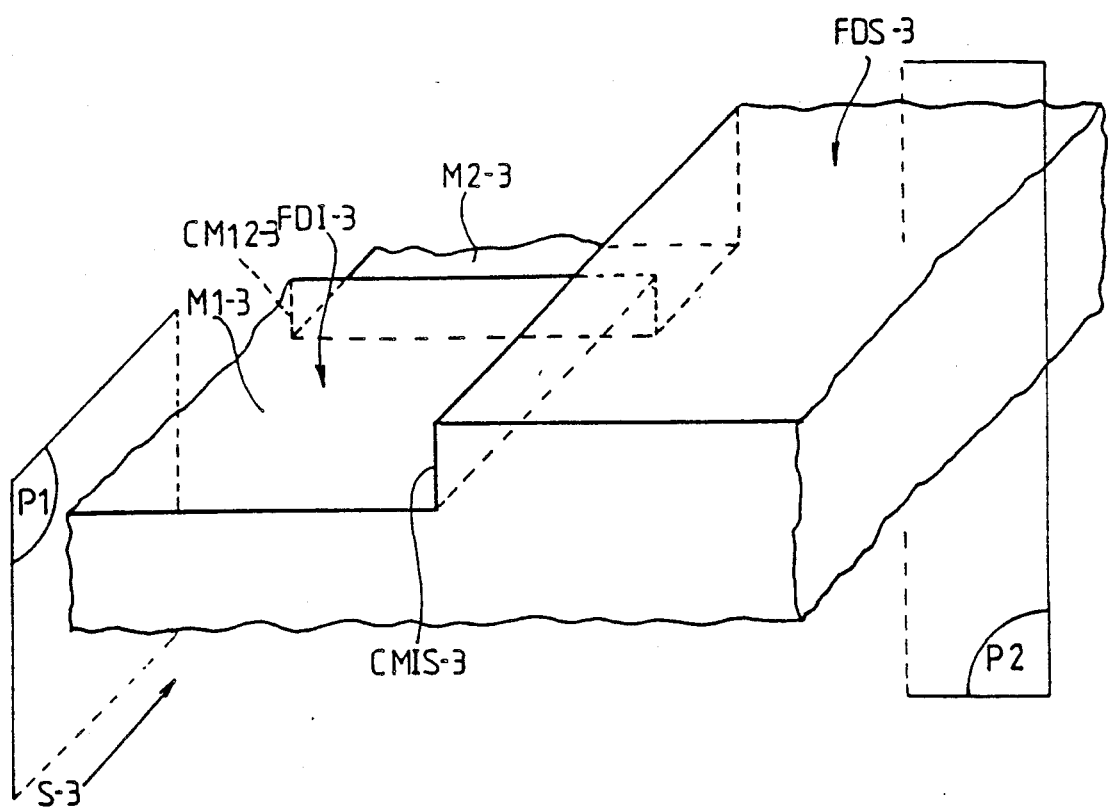
FIG. 13 is a diagram illustrating a stage for forming a substrate in a third embodiment of the method according to the invention.

As can be seen from FIG. 13, the substrate used for this embodiment has one part similar to that used for the previous embodiment, that is to say it has elongated treads Mi-3 parallel with one another and separated from one another by transitions CMij-3. Here it will be assumed that there are only two elongated treads M1-3 and M2-3 which are separated by a transition CM12-3.

The operation of producing the substrate S-3 here comprises furthermore the formation of a transverse riser CMIS-3 extending in a plane which is substantially at right-angles to the transition CM12-3 and defining on this substrate lower FDI-3 and upper FDS-3 bottoms. The height of this transverse riser is 1.5 microns in relation to the tread M1-3 and it has a height of 2.3 microns in respect of the tread M2-3.

There is defined on this stack a plane P1 parallel with the transverse tread and perpendicular to the elongated treads and a second plane P2 which is perpendicular to the plane P1.

Figure 14:
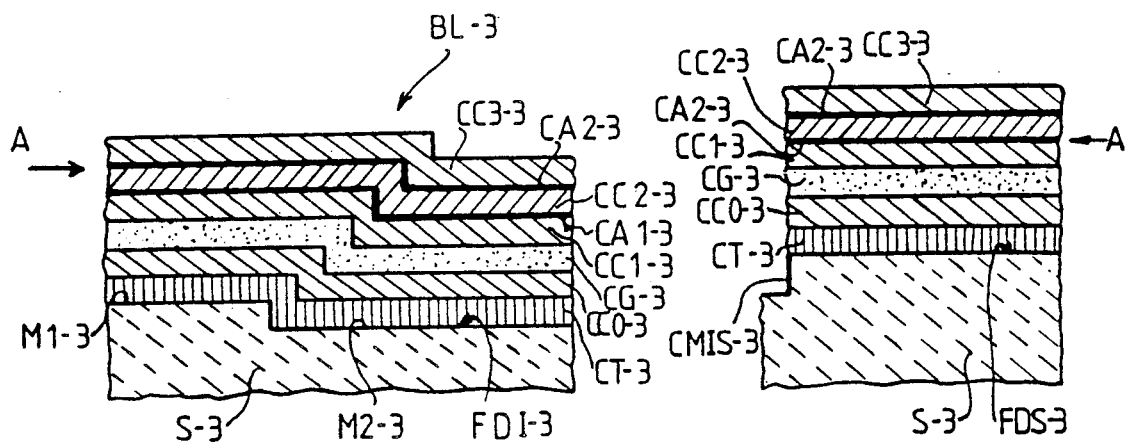
FIGS. 14 and 15 are diagrams illustrating two stages in the third embodiment of the method according to the invention.

FIG. 14 shows a stack formed in this embodiment. The left-hand part shows a section through this stack in the plane P1 while the right-hand part shows a section through the plane P2.

Here, the substrate is of the semi-insulating type gallium arsenide. In this case, it is then appropriate to deposit a buffer layer CT of type N+ gallium arsenide on the upper surface of this substrate. This layer is about 1 micron thick and is deposited by epitaxy on the upper surface of the substrate. However, the term substrate is used loosely to describe the assembly consisting of the semi-insulating type gallium arsenide and the type N+ buffer layer.

With regard to the previous embodiment, the current embodiment comprises an additional stage which is the deposition within the stack of a transparent layer which acts as a light guide for the luminous emissions from the various P-N junctions which have been created.

Thus, in a single multi-layer epitaxy there are successively deposited a first confining layer CCO-3 which is about 1 micron thick and then a transparent layer CG-3 of composition $Al_{0.2}Ga_{0.8}$ as about 1 micron thick and then another confining layer CC1-3 about 1 micron thick and then in succession a first active layer CA1-3, a confining layer CC2-3, a second active layer CA2-3 and finally a final confining layer CC3-3. It is noted then that the transparent layer CG-3 is bounded by two confining layers CCO-3 and CC1-3. Its refraction index is greater than the refraction indices of the two confining layers which frame it and the height of the transverse riser CMIS-3 is substantially equal to the distance which, in the sector carried by the lower bottom FDI-3, separates the median plane of the transparent layer CG-3 and the mean plane of the active layer CA1-3 in the zone supported by the lower tread M2-3.

Figure 15:
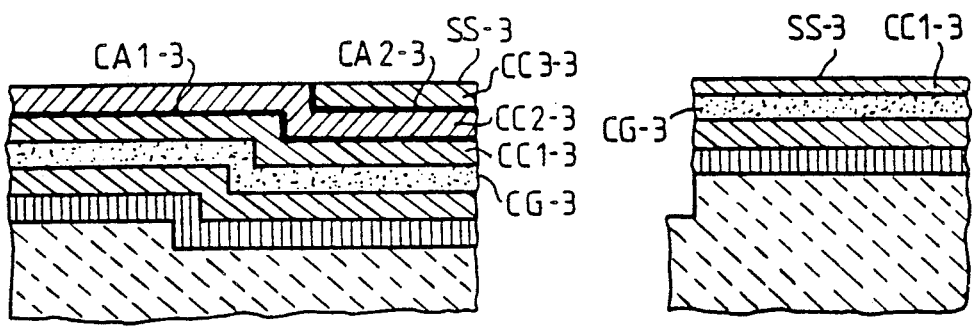
Figure 16:
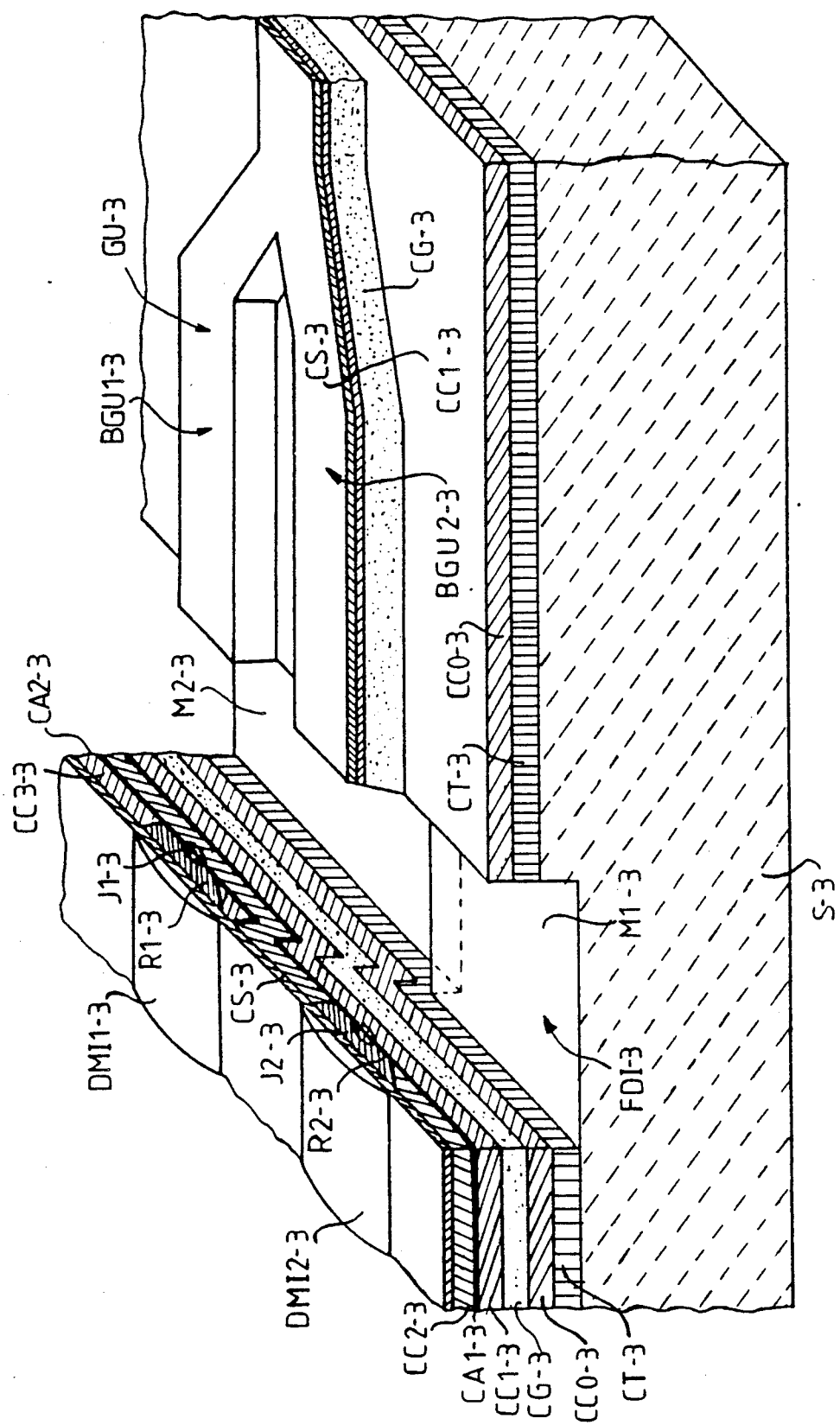
FIG. 16 is a diagram illustrating a semiconductor device obtained by this third alternative method.

The operation of levelling this stack is then carried out according to the arrows A and results in a block having a quasi-flat upper surface SS-3 (FIG. 15). The left-hand part of this FIG. 15 which corresponds to the left-hand part of FIG. 14, has a structure of the same type as that described in the previous embodiment and the right-hand part of this FIG. 15 which corresponds to the right-hand part of FIG. 14 shows on the buffer layer CT the confining layer CCO-3 and then the transparent layer CG-3 and finally a part of the confining layer CC1-3.

The following stages to produce the laser structure proper are identical with those described in the previous embodiment. The common contact deposit is this time deposited on the buffer layer CT and is not shown in FIG. 16.

With regard to preparation of the guide part proper, it is possible to conceive that the formation of this upper layer CS-3 is carried out after levelling according to the arrows A likewise over the part of this upper surface of the block carried by the upper bottom although this is not absolutely necessary.

The next operation consists of forming within the transparent layer CG-3 two branches BGU1-3 and BGU2-3, separate from each other and each having a first end situated opposite a P-N junction (respectively J1-3, J2-3) and connected at their respective opposite ends to be extended by a single portion TRO-3.

This forming operation can be carried out continuously by eroding using a photo-etching type of process.

Therefore, each branch BGUi-3 comprises on the confining layer CCO-3 the guide layer CG-3 surmounted by a residual thickness of confining layer CC1-3 and possibly surmounted by the upper layer CS-3. In this case, confinement of the light is due to the variation in index between, on the one hand, the guide layer CG-3 and the bottom confining layer CCO-3 and, on the other, between the guide layer CG-3 and the upper confining layer CC1-3. It will likewise be noted that the layer CG-3 appears on the guide wafer.

The laser structure proper and the guide part may be separated by a channel at right-angles to the laser strips or may be mutually joined by an almost vertical zone matching the form of the transverse riser of the substrate. If there is separation by a channel, then this is made in the vicinity of the transverse riser either in the laser part or in the guide part by chemical attack of the type already referred to hereinabove.

The guide GU-3 which is thus formed is therefore Y-shaped and makes it possible through the portion TRO-3 to achieve connection with a mono-mode fibre optic. Of course, should it be desirable to guide more than two light emissions, the guide GU would contain as many branches as P-N junctions.

The semiconductor device which is thus obtained (FIG. 16) is a monolithic component comprising, on the one hand, a structure capable of a laser effect and, on the other, a transparent layer forming a light guide for light emissions via P-N junctions. The median plane through this light layer is then substantially the same as the median plane containing the P-N junctions.

The upper part of the guide GU-3 is therefore substantially at the same level as the upper part of the laser part proper, which makes it possible to consider this component as quasi-flat.

Other ways of preparing the guide part are possible.

Thus it may be envisaged to erode all the layers carried by the guide layer CG-3 and then to accommodate the branches of the guide in this layer CG-3. Confinement of the light is then due to the variation in index between, on the one hand, the guide layer CG-3 and the bottom confining layer CCO-3 and, on the other, between the guide layer CG-3 and the air.

It may also be envisaged to materialise the guide form by making two branches and the single portion in the upper confining layer CC1-3, possibly surmounted by the upper layer CS-3; the guide layer CG3 in which the light emissions will be propagated is then not partially eroded and remains whole and flat.

The invention is not confined to the embodiments described hereinabove but embraces all possible variations thereof, in particular the following:

- it is for example possible to produce the multiwavelength semiconductor device not only in the Ga As system but also in the InP (indium phosphide) system, with suitable alloys or on any other semiconductor material having radiative optical properties.

Of course, certain of the means described hereinabove may be omitted in those alternative embodiments in which they serve no purpose. Furthermore, it should be noted that the first embodiment of the invention (FIGS. 1 to 6) could be considered independently of the other two.

We claim:

1. A semiconductor device comprising a substrate having disposed thereon at least two double heterostructure stacks, each stack comprising at least one active layer bounded by two confinement layers, said stacks being in the form of elongated strips disposed side by side, electrically insulated from each other, and having opposite transverse ends and an upper surface opposite said substrate, each said stack having active layers of compositions differing from one another and each said confinement and active layer being assigned a rank in order of disposing on said substrate, and each stack comprising a P-N junction therein which is individually and electrically operable and situated in the vicinity of an active layer of a different composition and rank in each stack, the opposite transverse ends of these strips being optically prepared, the upper surfaces of the strips forming an upper surface for the device which is substantially flat.

2. A device according to claim 1, wherein each stack comprises the same number of layers.

3. A device according to claim 1, wherein each stack comprises a different number of layers and the substrate comprises elongated steps which are parallel inter se and with the layers and are separated from each other by transitions.

4. A device according to claim 3, wherein the substrate further comprises a transverse riser extending in a plane substantially at right-angles to the parallel, elongated steps and to each transition and defining on said substrate a lower bottom and an upper bottom for one said stack which comprises at least adjacent the upper bottom a transparent layer which forms a light guide for luminous emissions via the P-N junctions of the stacks.

* * * * *